United States Patent
Yeh et al.

(10) Patent No.: US 8,980,706 B2
(45) Date of Patent: Mar. 17, 2015

(54) DOUBLE TREATMENT ON HARD MASK FOR GATE N/P PATTERNING

(75) Inventors: Matt Yeh, Hsinchun (TW); Fang Wen Tsai, Hsinchu (TW); Chi-Chun Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1285 days.

(21) Appl. No.: 12/370,276

(22) Filed: Feb. 12, 2009

(65) Prior Publication Data

US 2010/0068875 A1      Mar. 18, 2010

Related U.S. Application Data

(60) Provisional application No. 61/097,152, filed on Sep. 15, 2008.

(51) Int. Cl.
| | |
|---|---|
| *H01L 21/311* | (2006.01) |
| *H01L 21/283* | (2006.01) |
| *H01L 21/8238* | (2006.01) |
| *H01L 21/3213* | (2006.01) |
| *H01L 29/66* | (2006.01) |
| *H01L 29/51* | (2006.01) |

(52) U.S. Cl.
CPC .. *H01L 21/823842* (2013.01); *H01L 21/32139* (2013.01); *H01L 29/66545* (2013.01); *H01L 29/517* (2013.01)
USPC ............................ 438/199; 438/279; 438/585

(58) Field of Classification Search
USPC .......................... 438/587, 702; 257/E21.023
See application file for complete search history.

(56) References Cited

U.S. PATENT DOCUMENTS

| | | | |
|---|---|---|---|
| 6,211,034 B1 | 4/2001 | Visokay et al. | |
| 6,316,167 B1 * | 11/2001 | Angelopoulos et al. | ...... 430/313 |
| 6,468,896 B2 | 10/2002 | Rohr et al. | |
| 6,878,646 B1 * | 4/2005 | Tsai et al. | ..................... 438/756 |
| 7,097,779 B2 | 8/2006 | Mosden et al. | |
| 7,291,446 B2 | 11/2007 | Mosden et al. | |

(Continued)

OTHER PUBLICATIONS

Quirk, Michael and Serda, Julian, Semiconductor Manufacturing Technology,2001, Prentice-Hall, Inc., pp. 271 and 277 (ISBN 0130815209).*

(Continued)

*Primary Examiner* — Olik Chaudhuri
*Assistant Examiner* — Christine Enad
(74) *Attorney, Agent, or Firm* — Haynes and Boone, LLP

(57) ABSTRACT

The present disclosure provides a method that includes providing a semiconductor substrate having a first region and a second region, forming first and second gate stacks over the first and second regions, respectively, the first and second gate stacks each including a dummy gate electrode, removing the dummy gate electrodes from the first and second gate stacks, respectively, thereby forming trenches, forming a metal layer to partially fill the trenches, forming an oxide layer over the metal layer filling a remaining portion of the trenches, applying a first treatment to the oxide layer, forming a patterned photoresist layer on the oxide layer overlying the first region, applying a second treatment to the oxide layer overlying the second region, etching the oxide layer overlying the second region, etching the first metal layer overlying the second region, removing the patterned photoresist layer, and removing the oxide layer overlying the first region.

20 Claims, 5 Drawing Sheets

(56) References Cited

U.S. PATENT DOCUMENTS

| | | | |
|---|---|---|---|
| 2004/0214427 A1* | 10/2004 | Kloster et al. | 438/637 |
| 2005/0208434 A1* | 9/2005 | Mosden et al. | 430/323 |
| 2006/0263729 A1 | 11/2006 | Shea et al. | |
| 2007/0066077 A1* | 3/2007 | Akasaka et al. | 438/710 |
| 2007/0269979 A1* | 11/2007 | Cho | 438/669 |
| 2009/0101993 A1* | 4/2009 | Park et al. | 257/411 |
| 2010/0155844 A1* | 6/2010 | Takahashi | 257/348 |

OTHER PUBLICATIONS

Chinese Patent Office, Office Action dated Nov. 2, 2010, Application No. 200910173524.X, 5 pages.

* cited by examiner

DOUBLE TREATMENT ON HARD MASK FOR GATE N/P PATTERNING

PRIORITY DATA

This application claims priority to Provisional Application Ser. No. 61/097,152 filed on Sep. 15, 2008, entitled "Double Treatment On Hard Mask For Gate N/P Patterning," the entire disclosure of which is incorporated herein by reference.

BACKGROUND

When a semiconductor device such as a metal-oxide-semiconductor field-effect transistors (MOSFETs) is scaled down through various technology nodes, high k dielectric material and metal are adopted to form a gate stack. When forming such a device, the metal layer is tuned to have a proper work function for n-type MOSFETs and p-type MOSFETs to achieve the designed threshold voltage of the device. Currently, the metal layer in n-type MOSFETs and the metal layer in p-type MOSFETs are patterned using by an etching process procedure. However, a dry etch used for patterning could result in metal gate and high k dielectric film plasma damage. In addition, the dry etch could cause photoresist residue, which is difficult to remove. On other side, a wet etch used for patterning could cause lateral etch issue and degrade N/P patterning profile.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Particularly.

DETAILED DESCRIPTION

Figure 1:
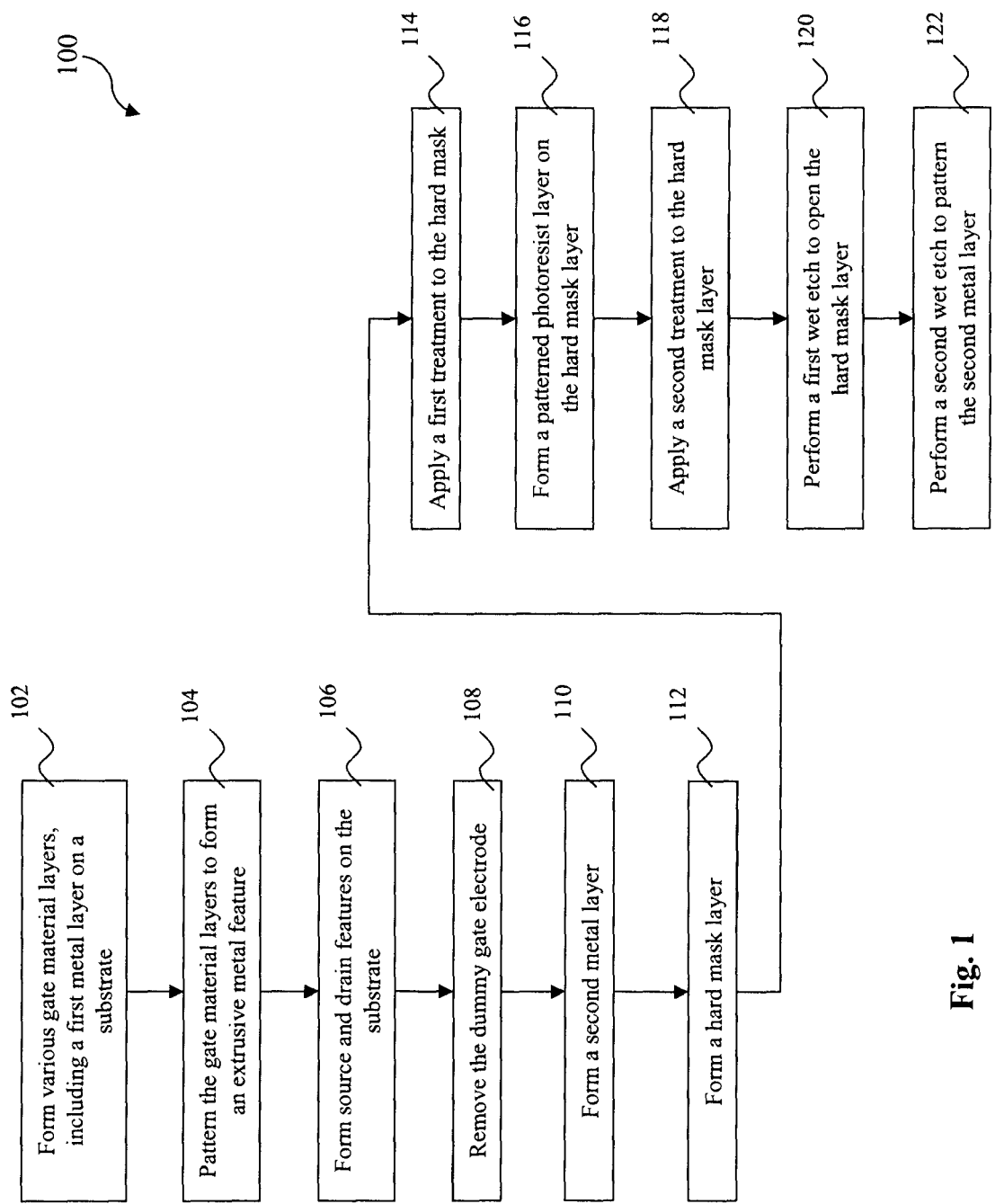
FIG. 1 is a flowchart of a method for making a semiconductor device having a metal gate structure constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
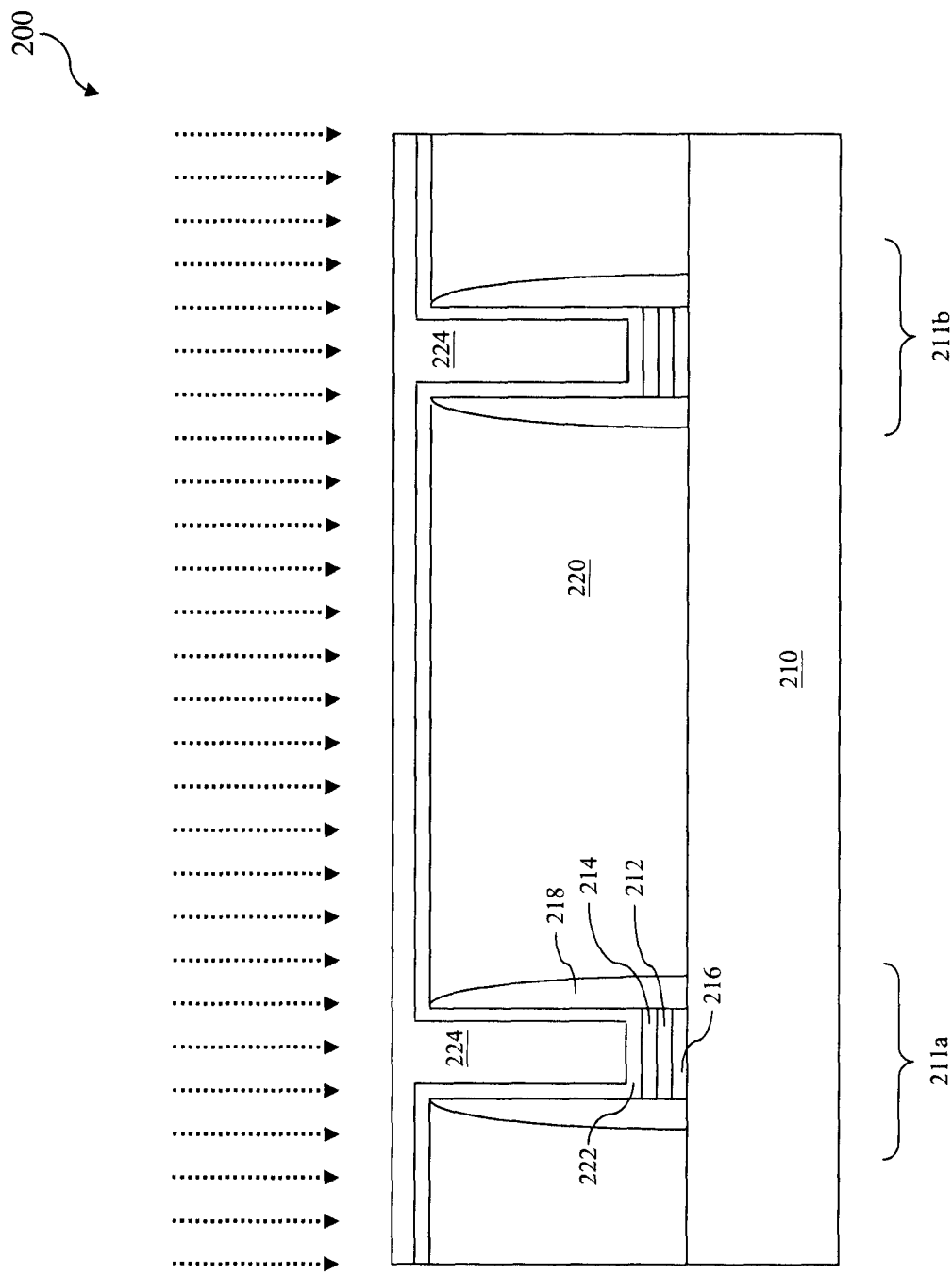
FIGS. 2 through 4 are sectional views of a semiconductor device having a metal gate structure constructed according to aspects of the present disclosure in various embodiments.
Figure 3:
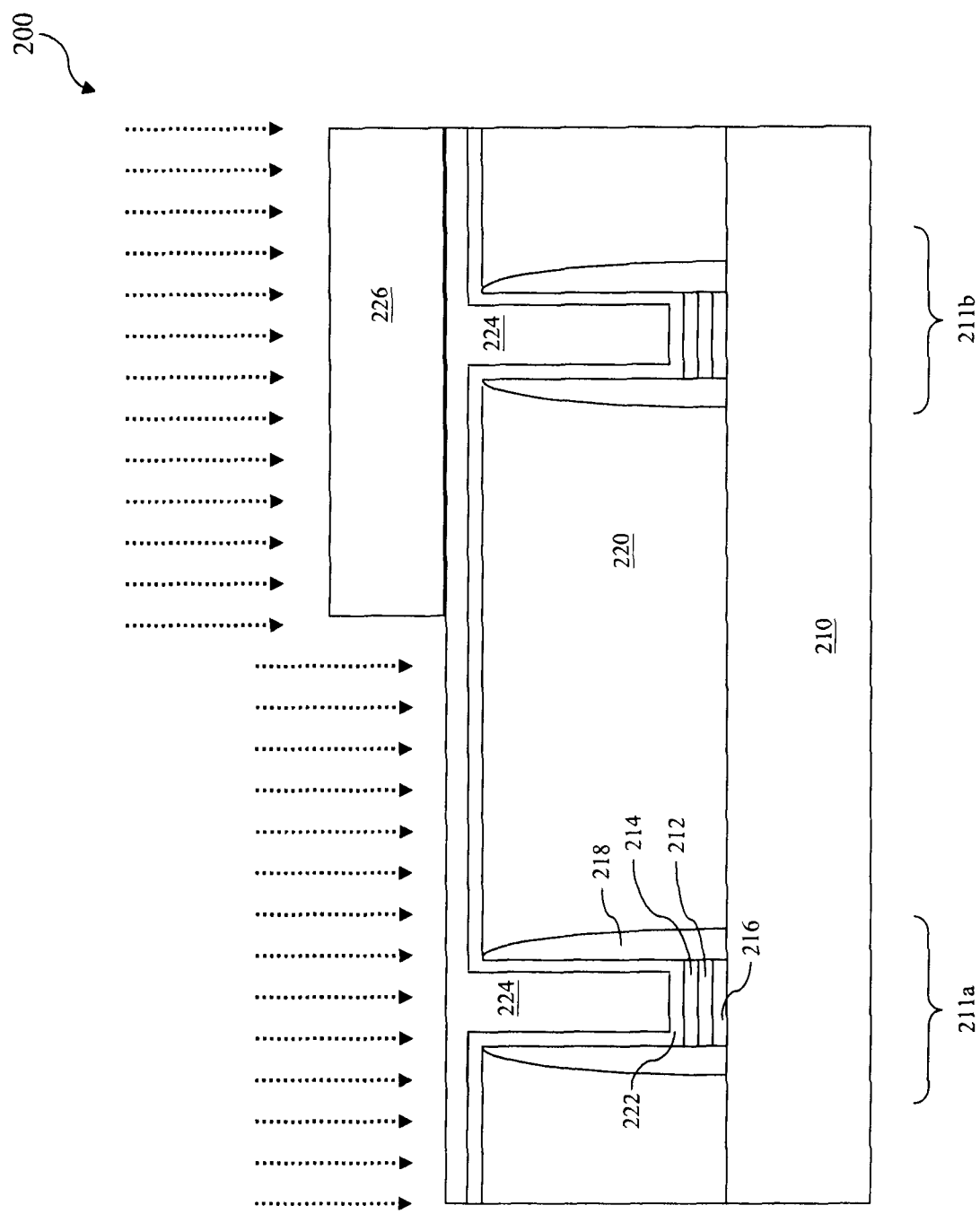
Figure 4:
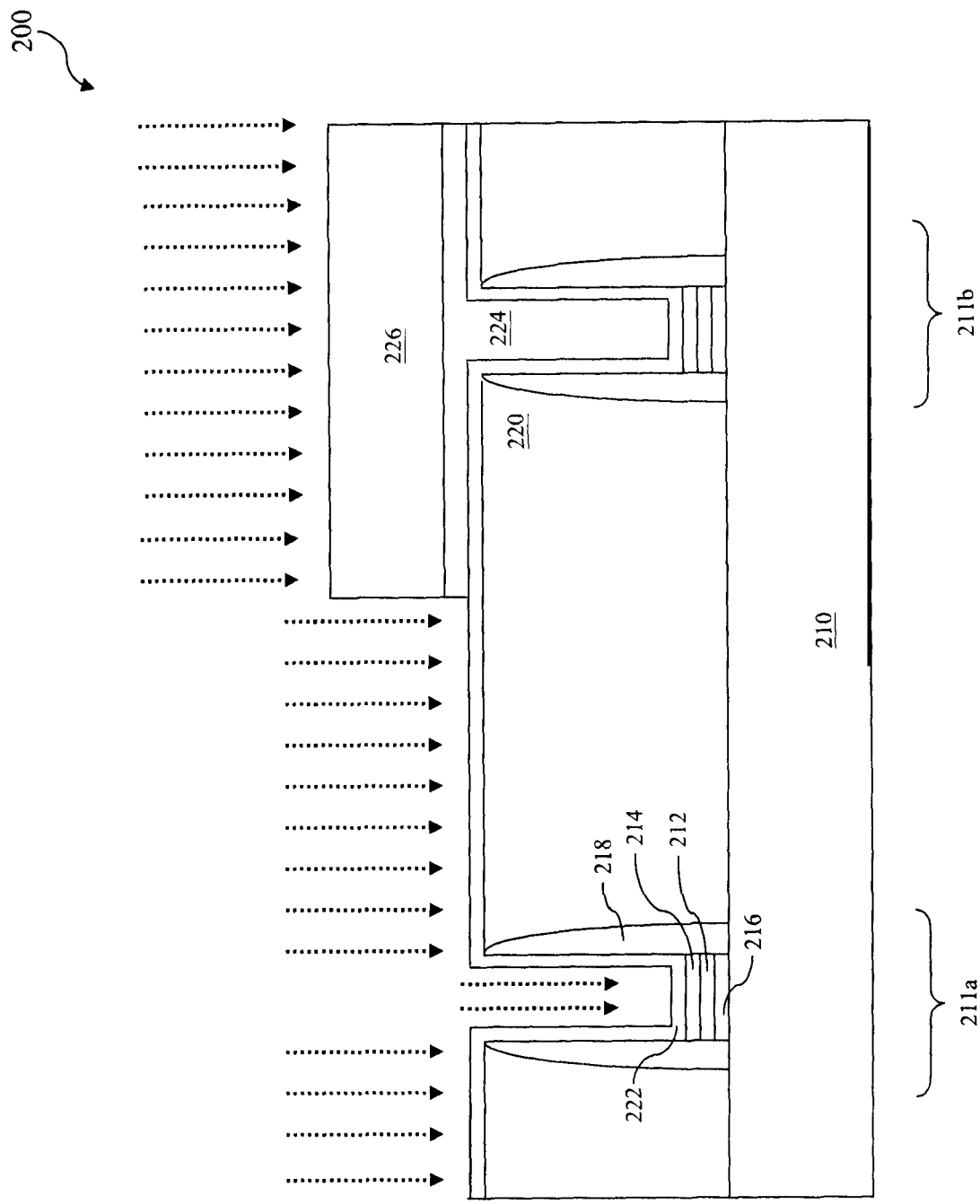

FIG. 1 is a flowchart of a method 100 for making a semiconductor device having a metal gate structure constructed according to aspects of the present disclosure. FIGS. 2 through 4 are sectional views of an embodiment of a semiconductor 200 structure having a metal gate structure at various fabrication stages constructed according to various aspects of the present disclosure. The method 100 is described below with reference to FIGS. 1 through 4.

Referring to FIGS. 1 and 2, the method 100 begins at step 102 by forming various gate material layers on a semiconductor substrate 210. The semiconductor substrate 210 includes silicon. Alternatively, the substrate 210 includes germanium, silicon germanium or other suitable semiconductor material. In other embodiments, the substrate 210 may use another semiconductor material such as diamond, silicon carbide (SiC), gallium arsenic (GaAs), gallium arsenic phosphorus (GaAsP), aluminum indium arsenic (AlInAs), aluminum gallium arsenic (AlGaAs), gallium indium phosphorus (GaInP), or other proper combination thereof. The substrate includes an n-type field effect transistor (FET) region 211a (or NFET), and a p-type FET region 211b (or PFET).

In one embodiment, a high k dielectric material layer 212 is formed on the semiconductor substrate 210. The high k dielectric material layer 212 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes $HfO_2$. Alternatively, the high k dielectric material layer includes metal nitrides, metal silicates or other metal oxides. In another embodiment, the high k dielectric material layer includes hafnium oxide ($HfO_2$), hafnium silicon oxide (HfSiO), hafnium silicon oxynitride (HfSiON), hafnium zirconium oxide (HfZrO), or other suitable high dielectric. The high k dielectric material layer may have a thickness ranging between about 10 angstrom and about 30 angstrom.

A first metal layer (wet etch stop later) 214 may be formed on the high k dielectric material layer 212. The metal layer 214 includes tantalum nitride (TaN), tantalum silicon nitride (TaSiN), tungsten (W), tantalum carbide (TaC), tantalum carbide nitride (TaCN), titanium aluminum nitride (TiAlN), aluminum (Al), titanium nitride (TiN) or titanium (Ti) in various examples. The first metal layer may have a thickness ranging between about 10 angstrom and about 200 angstrom.

An interfacial layer (IL) 216 may be additionally formed on the substrate and is interposed between the semiconductor substrate 210 and the high k dielectric material layer 212. The interfacial layer 216 includes a thin silicon oxide layer in one example. The thin silicon oxide is formed on the substrate 210 before forming the high k dielectric material layer. The thin silicon oxide layer may be formed by atomic layer deposition (ALD) or thermal oxidation. The IL layer may have a thickness ranging between about 5 angstrom and about 10 angstrom.

A dummy gate electrode layer is formed on the first metal layer 214. In one embodiment, the dummy gate electrode layer include polysilicon formed by a chemical vapor deposition (CVD) process using a proper precursor, such as silane ($SiH_4$).

The method 100 proceeds to step 104 by patterning the various gate material layers to form a dummy gate stack. In one embodiment, a patterned photoresist layer is formed on the multiple metal-gate-stack layers. The patterned photoresist layer is formed on the gate material layers and is used as a mask to form the dummy gate stack. In this case, the patterned photoresist is formed on the polysilicon layer. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. Alternatively, a hard mask patterned may be formed as a mask to pattern the dummy gate stack. In this case, the a hard mask layer is deposited on the substrate and then is patterned using a patterned photoresist layer by a lithography process and an etching process.

The dummy gate electrode layer, the first metal layer, the high k dielectric material layer within the openings of the patterned photoresist are removed by a first etching process. In one embodiment, the first etching process may utilize a wet etching process to pattern the gate layers. In another example, the first etching process may utilize a dry etching process with fluorine-containing plasma to remove the polysilicon. For example, the etch gas includes CF4. Alternatively, the first etching process may include multiple etching steps to etch the gate material layers.

The method 100 proceeds to step 106 by forming various transistor features. Lightly doped drain (LDD) regions are formed by an ion implantation process using the dummy gate stack as an implanting mask.

Then a spacer 218 is formed on the sidewalls of the gate stack by a technique known in the art. For example, the spacer 218 includes silicon nitride and is formed by a chemical vapor deposition (CVD) and a dry etching process. Then source/drain regions are formed in the substrate by another ion implantation process. The silicide features may be further formed on the source/drain regions to reduce the contact resistance.

The method 100 further forms an inter-level dielectric (ILD) layer 220 on the substrate 210. The ILD layer 220 includes silicon oxide, low k material layer or other suitable dielectric material, formed by CVD or other suitable method. For example, the ILD layer is formed by a high density plasma CVD. The ILD layer is disposed on the substrate between the multiples dummy gate stacks and on the dummy gate stacks.

The method 100 further includes a chemical mechanical polishing (CMP) process to polish the ILD layer 220 and reduce the thickness of the ILD layer to expose the dummy gate electrodes in NFET region 211a and PFET region 211b.

The method 100 proceeds to step 108 by removing the dummy gate electrode. The dummy gate electrode is removed by an etching process, resulting in a gate trench as illustrated in FIG. 2. In this particular example, one gate trench in NFET region 211a and another gate trench in PFET region 211b.

The method 100 proceeds to step 110 by forming a second metal layer 222 on the substrate. The second metal layer is deposited in the gate trenches and the on the ILD layer 220 as illustrated in FIG. 2. Within the gate trenches, the second metal layer 222 is formed on the first metal layer 214 on the bottom of the gate trench and the sidewall of the spacer. The second metal layer includes a p metal (tuned to have a proper work function for p-type transistors) in one embodiment. The second metal gate layer 222 is formed by PVD or other suitable process. In one embodiment, the second metal layer includes titanium nitride. In other embodiments, the second metal layer may alternatively include titanium, tungsten nitride, tantalum nitride, tantalum silicon nitride, molybdenum nitride, tungsten, tantalum carbide, tantalum carbide nitride, titanium aluminum nitride, aluminum, or a combination thereof. The second metal layer may have a thickness ranging between about 10 angstrom and about 200 angstrom. Alternatively, the second metal layer may include an n metal (tuned to have a proper work function for n-type transistors).

The method 100 proceeds to step 112 by forming a hard mask layer 224 on the substrate. The hard mask layer 224 substantially fills in the various gate trenches. The hard mask 224 includes an oxide, such as silicon oxide. In another example, the hard mask layer may additionally or alternatively include low k dielectric material. In another example, the hard mask layer 224 includes an oxide material from or formed by spin-on glass (SOG), low-k film, tetraethyl orthosilicate (TEOS), plasma enhance CVD oxide (PE-oxide), high-aspect-ratio-process (HARP) formed oxide. The hard mask layer 224 may have a thickness ranging between about 100 angstrom and about 5000 angstrom. In one example, the hard mask layer 224 has a thickness of about 2000 angstrom.

Still referring to FIG. 2, the method 100 proceeds to step 114 by applying a first treatment to the hard mask layer 224. In one embodiment, the first treatment uses a dry oxygen plasma. As one example, the first treatment may include an argon flow of about 150 sccm, an oxygen flow of about 30 sccm, a total pressure of about 7.5 mT, and a treatment duration of about 10 seconds. In another embodiment, the first treatment uses a sulfuric peroxide mixture (SPM) solution. In another embodiment, the first treatment includes ozone (O3) and de-ionized water (DIW).

Referring to FIGS. 1 and 3, the method 100 proceeds to step 116 by forming a patterned photoresist layer 226 as illustrated in FIG. 3. In one embodiment, a patterned photresist layer is formed on the PFET region 211b. The patterned photoresist layer is formed on the hard mask layer and is used as a mask to open the hard mask layer. The patterned photoresist layer is formed by a photolithography process, including exemplary processing steps of photoresist coating, soft baking, mask aligning, exposing, post-exposure baking, developing photoresist and hard baking. The photolithography exposing process may also be implemented or replaced by other proper methods such as electron-beam writing, ion-beam writing, and molecular imprint.

The method 100 proceeds to step 118 by applying a second treatment to the hard mask layer. The second treatment is also applied to the patterned photoresist layer. In one embodiment, the second treatment uses a dry oxygen plasma. As one example, the first treatment may include an argon flow of about 120 sccm, an oxygen flow of about 60 sccm, a total pressure of about 7.5 mT, and a treatment duration of about 20 seconds. In another embodiment, the first treatment uses a SPM solution. In another embodiment, the first treatment includes ozone O3 and de-ionized water.

Referring to FIGS. 1 and 4, the method 100 proceeds to step 120 by applying a wet etching process to open the hard mask. In one embodiment, the wet etching process used to open the hard mask layer uses hydrofluoric acid (HF). In one example, the HF solution have a concentration range from about 1:5 to about 1:1000. The etching duration may range from about 10 seconds to about 5 minutes. In another example, a diluted HF (DHF) solution have a concentration of about 1:100. DHF solution temperature is about room temperature. The etching duration is about 20 seconds in this particular case Then the method 100 proceeds to step 122 by wet etching the second metal for n metal patterning (or p metal patterning). For example, the p metal within the NFET (NMOS) region is removed and the p metal within the PFET (PMOS)

region remains. The patterned photoresist layer may be removed before or after the etch step 122.

In present disclosure, a double treatment to the hard-mask procedure is designed to control different wet etch rate between photoresist (PR) regions and open regions to reduce the wet lateral etch issue. The hard-mask layer includes an oxide film, such as SOG and low-k film. In various embodiments of the present disclosure, the double-treatment to the hard-mask to control HF wet etch rate and further reduce the lateral etch. By forming a hard mask layer on gate metal layer (n metal or p metal) and applying the double treatment before the gate metal etching, the lateral etching rate is reduced. The structure and performance of the patterned gate metal are improved. Furthermore, the disclosed method enhances PR adhesion capability on the metal film and significantly reduces lateral etch effect by wet etch. Other advantages may present in various applications, such as plasma damage free because of no dry etch process at open area, and/or PR residue free due to no dry etch process at open-area.

Although not shown, other processing step may present to form various features. For example, the oxide hard mask and double treatment approach described above is used to pattern the p metal layer. The similar process flow can be applied alternatively or additionally to pattern an n metal layer. In another example, a gate electrode material is formed after the patterning of the N/P metals. The gate electrode includes aluminum, tungsten or other suitable conductive material. The gate electrode material substantially fills in the gate trenches. Then another CMP process may be followed to polish the substrate and remove excessive the gate electrode material. In another example, various doped regions, such as n-wells and p-wells are formed in the substrate before the formation of the metal gate stacks. N-type dopant impurities employed to form the associated doped regions may include phosphorus, arsenic, and/or other materials. P-type dopant impurities may include boron, indium, and/or other materials.

In one embodiment, the multilayer interconnection (MLI) are further formed after the formation of the metal gate stacks. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

In another embodiment, the isolation features in the substrate may include shallow trench isolation (STI). The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. In another example, the gate spacers may have a multi-layer structure and may include silicon oxide, silicon nitride, silicon oxynitride, or other dielectric material.

Although embodiments of the present disclosure have been described in detail, those skilled in the art should understand that they may make various changes, substitutions and alterations herein without departing from the spirit and scope of the present disclosure. For example, the method 100 only provides a process flow to form metal gate stacks in a gate-last process using an oxide hard mask, double treatment and wet etchings as designed in FIG. 1 and the relevant description. However, in another embodiment, the similar method can also be used to form metal stack in a gate-first process wherein the metal gate is patterned first using the disclosed oxide hard mask, double treatment to the hard mask and wet etchings. Then the LDD regions, gate spacers, source and drain regions are formed thereafter. In another embodiment, the similar method can also be used to form metal stacks in a hybrid process wherein the n metal is patterned in a gate-first process and a p metal is patterned afterward in a gate-last process, or vice versa. These metal patterning processes use the disclosed oxide hard mask, double treatment to the hard mask and wet etchings to the hard mask and the metal layer, in order to reduce the lateral etching effect to the metal layer during the wet etch patterning. In another example, the oxide hard mask and double treatment approach described above is used to pattern n metal. The similar process flow can be applied alternatively or additionally to pattern the p metal layer.

Figure 5:
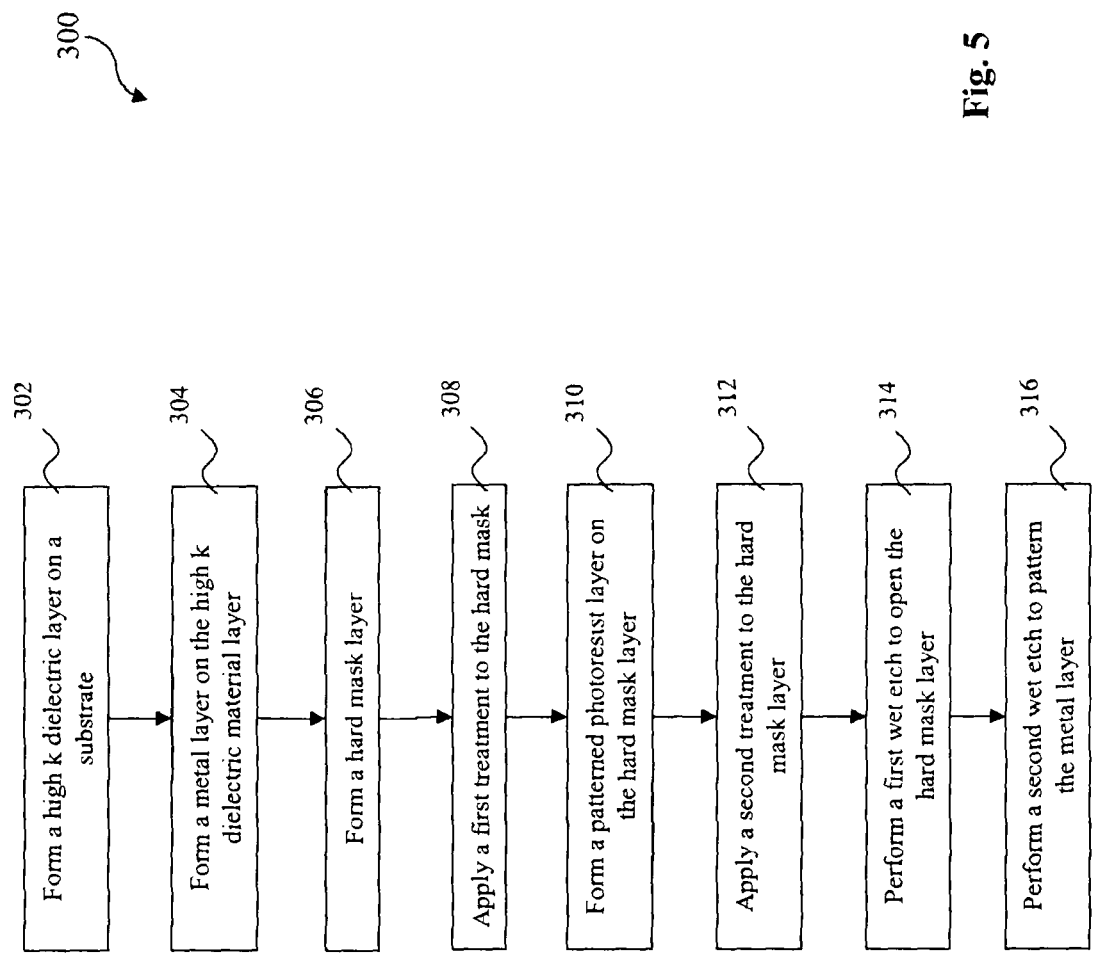
FIG. 5 a flowchart of another method for making a semiconductor device having a metal gate structure constructed according to various aspects of the present disclosure.

FIG. 5 is another embodiment of a flowchart of a method 300 for making a semiconductor device having a metal gate structure constructed according to aspects of the present disclosure. As another embodiment of the disclosed method applicable to metal patterning in a gate-first process, a hybrid process or other suitable process flow, the method 300 is illustrated in FIG. 5 and is further described briefly. The method 300 includes a step 302 of forming high k dielectric material layer on a substrate, a step 304 of forming a metal layer on the high k dielectric layer, a step 306 of forming a hard mask layer on the metal layer, a step 308 of applying a first treatment to the hard mask layer, a step 310 of forming a patterned photoresist layer on the hard mask layer, a step 312 if applying a second treatment to the hard mask layer, a step 314 of performing a first wet etching process to open the hard mask layer, and a step 316 of performing a second wet etching process to pattern the metal layer. In this methods, additional gate material layers, such as capping layer, may present. Other processing steps, forming an interfacial layer, may also present. The first and second treatments, the hard mask layer, and the wet etchings to the hard mask and metal layer may be substantially similar to the relevant processes and materials used in the method 100 as illustrated in FIG. 1.

The present disclosure is not limited to applications in which the semiconductor structure includes a MOS transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor device 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others. In another example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

Thus, the present disclosure provides a method for making a semiconductor device. The method includes forming a high k dielectric material layer on a substrate having a first region and a second region; forming a first metal layer on the high k dielectric material layer; forming an oxide layer on the first metal layer; applying a first treatment to the oxide layer; forming a patterned photoresist layer on the oxide layer, covering the first region; applying a second treatment to the oxide layer; etching the oxide layer in the second region using a first wet etching process; etching the first metal layer using a second wet etching process; stripping the patterned photoresist layer; and removing the oxide layer using a third wet etching process.

In one embodiment of this disclosed method, the first treatment includes a dry oxygen plasma. The first treatment may include an argon flow of about 150 sccm, an oxygen flow of about 30 sccm, a total pressure of about 7.5 mT, and/or a treatment duration of about 10 seconds according to one or more embodiments. The second treatment may also include a dry oxygen plasma. In one example, the second treatment includes an argon flow of about 120 sccm, an oxygen flow of about 60 sccm, a total pressure of about 7.5 mT, and a treatment duration of about 20 seconds. The first treatment or second treatment may include a sulfuric peroxide mixture (SPM) solution. The first treatment or second treatment may include ozone (O3) and de-ionized water (DIW). The oxide layer may include silicon oxide. In one embodiment, the oxide layer includes spin-on glass (SOG) formed by spin-on coating. The oxide layer may be formed by other method, such as CVD using TEOS, plasma enhanced CVD or high aspect ratio process (HARP). The oxide layer may additionally or alternatively include a low k dielectric material. The etching of the oxide layer may use a hydroflouric acid (HF). The etching of the first metal layer may include using a NH4OH and H2O2 solution (SC1). The stripping of the patterned photoresist layer includes using a wet chemical, such as N-Methylpyrrolidone or N-methyl-2-pyrrolidine (NMP), PR strip solvent/chemical or H2SO4. The removing of the oxide layer may use a hydroflouric acid (HF). The first metal layer may include titanium nitride (TiN). The first metal layer may alternatively include TaN, TaSiN, W, TaC, TaCN, TiAlN, Al, TiN or Ti. The high k dielectric material may include HfO2, HfSiO, HfSiON or HfZrO. The method may further include forming dummy polysilicon on the substrate; patterning the dummy polysilicon; forming light doped drain (LDD) regions in the substrate; forming gate spacer; and forming source and drain regions.

The present disclosure also provides another embodiment of a method for making a semiconductor device. The method includes forming an interfacial layer on a semiconductor substrate having a first region and a second region; forming a high k dielectric material layer on the interfacial layer; forming a first metal layer on the high k dielectric material layer; forming a dummy gate electrode on the first metal layer; patterning the dummy gate electrode, the first metal feature and the high k dielectric material layer to form a first dummy gate stack in the first region and a second dummy gate in the second region; forming a light doped drain (LDD) features in the semiconductor substrate; forming a spacer on sidewalls of the first and second dummy gate stacks; forming source and drain regions in the semiconductor substrate; forming an inter-level dielectric (ILD) material layer on the semiconductor substrate; performing a chemical mechanical polishing (CMP) process to the semiconductor substrate; removing the dummy gate electrodes; forming a second metal feature on the gate trench; forming an oxide layer on the semiconductor substrate; applying a first treatment to the oxide layer; forming a patterned photoresist layer on the oxide layer, covering the first region; applying a second treatment to the oxide layer; etching the oxide layer using a first wet etching process; etching the second metal layer using a second wet etching process; stripping the patterned photoresist layer; and removing the oxide layer using a third wet etching process.

In this method, the first metal layer may include a metal selected from the group consisting of TaN, TaSiN, W, TaC, TaCN, TiAlN, Al, TiN and Ti. The second metal layer may include a metal selected from the group consisting of titanium nitride (TiN), tungsten nitride (WN), tantalum nitride (TaN), tantalum silicon nitride (TaSiN), tungsten (W), tantalum carbide (TaC), tantalum carbide nitride (TaCN), titanium aluminum nitride (TiAlN), aluminum (Al), and titanium (Ti). At least one of the first and second treatment may include one of dry O2, SPM, DIW-O3 and H2O2. The oxide layer may include silicon oxide. The oxide layer may include SOG, low-k film, TEOS, PE-oxide or HARP oxide.

The present disclosure also provides a method for making a semiconductor device. The method includes forming a high k dielectric material layer on a substrate; forming a metal layer on the high k dielectric material layer; forming a hard mask layer on the metal layer; applying a first treatment to the hard mask layer; forming a patterned photoresist layer on the hard mask layer; applying a second treatment to the oxide layer; etching the hard mask layer through openings of the patterned photoresist layer; etching the first metal layer through openings of the hard mask layer using a second wet etching process; stripping the patterned photoresist layer; and removing the hard mask layer using a third wet etching process.

The present disclosure also provides a method for making a semiconductor device. The method includes forming a metal layer over a substrate; forming a hard mask layer on the metal layer; applying a first treatment to the hard mask layer; forming a patterned photoresist layer on the hard mask layer; applying a second treatment to the oxide layer; etching the hard mask layer through openings of the patterned photoresist layer; etching the metal layer through openings of the hard mask layer using a second wet etching process; stripping the patterned photoresist layer; and removing the hard mask layer using a third wet etching process. At least one of the first and second treatments may include performing one of dry oxygen, SPM, DIW-O3 and H2O2.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making a semiconductor device, comprising:
providing a semiconductor substrate having a first region and a second region;

forming a first gate stack over the first region and a second gate stack over the second region, the first and second gate stacks each including a dummy gate electrode;
removing the dummy gate electrodes from the first and second gate stacks, respectively, thereby forming trenches;
forming a metal layer to partially fill the trenches;
forming an oxide layer over the metal layer so that the trenches are completely filled;
applying a first treatment to the oxide layer;
forming a patterned photoresist layer on the oxide layer overlying the first region;
applying a second treatment to the oxide layer overlying the second region such that the patterned photoresist layer protects the oxide layer overlying the first region from the second treatment;
etching the oxide layer overlying the second region;
etching the first metal layer overlying the second region;
removing the patterned photoresist layer; and
removing the oxide layer overlying the first region.

2. The method of claim 1, wherein the first treatment comprises a dry oxygen plasma.

3. The method of claim 2, the first treatment comprises an argon flow of about 150 sccm, an oxygen flow of about 30 sccm, a total pressure of about 7.5 mT, and a treatment duration of about 10 seconds.

4. The method of claim 1, wherein the second treatment comprises a dry oxygen plasma.

5. The method of claim 4, the second treatment comprises an argon flow of about 120 sccm, an oxygen flow of about 60 sccm, a total pressure of about 7.5 mT, and a treatment duration of about 20 seconds.

6. The method of claim 1, wherein one of the first treatment and second treatment comprises a sulfuric peroxide mixture (SPM) solution.

7. The method of claim 1, wherein one of the first treatment and second treatment comprises ozone (O3) and de-ionized water (DIW).

8. The method of claim 1, wherein the oxide layer comprises silicon oxide.

9. The method of claim 8, wherein the oxide layer comprises spin-on glass (SOG).

10. The method of claim 1, wherein the oxide layer is formed by one of tetraethyl orthosilicate (TEOS), plasma enhanced chemical vapor deposition (PE-oxide), and high-aspect-ratio-process formed oxide (HARP oxide).

11. The method of claim 1, wherein etching the oxide layer comprises wet etching using a hydroflouric acid (HF).

12. The method of claim 1, wherein etching the metal layer comprises wet etching using a ammonium hydroxide (NH4OH) and hydrogen peroxide (H2O2) solution.

13. The method of claim 1, wherein removing the oxide layer comprises wet etching using a hydrofluoric acid (HF).

14. The method of claim 1, wherein the metal layer comprises a metal selected form the group consisting of tantalum nitride (TaN), tantalum silicon nitride (TaSiN), tungsten (W), tantalum carbide (TaC), tantalum carbide nitride (TaCN), titanium aluminum nitride (TiAlN), aluminum (Al), titanium nitride (TiN) and titanium (Ti).

15. The method of claim 1, wherein the first and second gate stacks each includes a high k dielectric material comprising a material selected from the group consisting of hafnium oxide (HfO2), hafnium silicon oxide (HfSiO), hafnium silicon oxynitride (HfSiON), and hafnium zirconium oxide (HfZrO).

16. A method for making a semiconductor device, comprising:
providing a semiconductor substrate including a first gate structure formed over a first region and a second gate structure formed over a second region;
removing a dummy gate electrode from each of the first and second gate structures thereby forming gate trenches;
forming a metal layer to partially fill the gate trenches;
forming an oxide layer over the metal layer to completely fill the gate trenches;
applying a first treatment to the oxide layer;
forming a patterned photoresist layer on the oxide layer overlying the first region;
applying a second treatment to the oxide layer overlying the second region but not to the oxide layer overlying the first region;
wet etching the oxide layer overlying the second region;
wet etching the metal layer overlying the second region;
stripping the patterned photoresist layer; and
wet etching the oxide layer overlying the first region.

17. The method of claim 16, wherein the first or second treatment comprises one of dry oxygen (O2), sulfuric peroxide mixture (SPM), ozone and de-ionized water (DIW-O3) mixture, and hydrogen peroxide (H2O2).

18. A method for making a semiconductor device, comprising:
providing a semiconductor substrate including a first gate structure formed over a first region and a second gate structure formed over a second region, the first and second gate structures each including a high-k gate dielectric and a dummy gate electrode formed over the high-k gate dielectric;
removing the dummy gate electrode from each of the first and second gate structures thereby forming gate trenches;
forming a metal layer over the substrate partially filling the gate trenches;
forming a hard mask layer over the metal layer to completely fill the gate trenches;
applying a first treatment to the hard mask layer;
forming a patterned photoresist layer to protect the hard mask layer overlying the first region;
applying a second treatment to the unprotected hard mask layer overlying the second region;
etching the unprotected hard mask layer overlying the second region with a first wet etching process;
etching the metal layer overlying the second region with a second wet etching process;
stripping the patterned photoresist layer; and
removing the remaining hard mask layer overlying the first region with a third wet etching process.

19. The method of claim 18, wherein the hard mask layer include silicon oxide.

20. The method of claim 19, wherein the first or second treatment comprises treating with one of dry oxygen (O2), sulfuric peroxide mixture (SPM), ozone and de-ionized water (DIW-O3) mixture, and hydrogen peroxide (H2O2).

* * * * *